(12) United States Patent
Huang et al.

(10) Patent No.: US 10,890,841 B2
(45) Date of Patent: Jan. 12, 2021

(54) CAMERA MODULE TESTING FIXTURE

(71) Applicant: TRIPLE WIN TECHNOLOGY (SHENZHEN) CO. LTD., Shenzhen (CN)

(72) Inventors: Chun-Yao Huang, New Taipei (TW); Cheng-An Lin, New Taipei (TW)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 16 days.

(21) Appl. No.: 16/411,401

(22) Filed: May 14, 2019

(65) Prior Publication Data

US 2020/0201166 A1 Jun. 25, 2020

(30) Foreign Application Priority Data

Dec. 20, 2018 (CN) .......................... 2018 1 1564351

(51) Int. Cl.
*G01R 31/14* (2006.01)
*G03B 43/00* (2006.01)
*G01R 31/28* (2006.01)

(52) U.S. Cl.
CPC ......... *G03B 43/00* (2013.01); *G01R 31/2825* (2013.01)

(58) Field of Classification Search
CPC .. G01R 31/2825; G03B 17/24; G03B 17/265; H04N 17/002; H04N 5/2257
See application file for complete search history.

(56) References Cited

U.S. PATENT DOCUMENTS

| | | | | |
|---|---|---|---|---|
| 5,784,660 A | * | 7/1998 | Tanaka | G03B 17/02 396/310 |
| 2003/0112360 A1 | * | 6/2003 | Liao | H04N 17/002 348/362 |
| 2007/0292127 A1 | * | 12/2007 | Kuhmann | H01L 27/14618 396/529 |
| 2009/0167869 A1 | * | 7/2009 | Knoedgen | H04N 17/00 348/187 |
| 2012/0229652 A1 | * | 9/2012 | Lee | G03B 43/00 348/187 |
| 2014/0204219 A1 | * | 7/2014 | Kim | H04N 17/002 348/187 |

FOREIGN PATENT DOCUMENTS

TW M302720 U 12/2006

\* cited by examiner

*Primary Examiner* — Thang X Le
(74) *Attorney, Agent, or Firm* — ScienBiziP, P.C.

(57) ABSTRACT

A camera module testing fixture for testing a performance of a camera module includes a mounting body, a fixture block set detachably mounted to the mounting body, an actuating module, a cover fixed on the actuating module, and a base. The mounting body and the actuating module are disposed on a same first side of the base. The actuating module is configured to move the cover along a first direction to above the fixture block set and further configured to move the cover along a second direction perpendicular to the first direction and perpendicular to the mounting body.

19 Claims, 4 Drawing Sheets

CAMERA MODULE TESTING FIXTURE

FIELD

The subject matter herein generally relates to camera modules, and more particularly to a camera module testing fixture.

BACKGROUND

Generally, during production of camera modules, the camera modules are functionally tested using a test fixture on a production line. The test fixture is generally provided with a receiving slot matching a shape and size of the camera module. However, sometimes a shape of the camera module is desired to be changed during a development phase of the camera module, so that the receiving slot of the test fixture no longer matches the shape of the camera module.

BRIEF DESCRIPTION OF THE DRAWINGS

Implementations of the present disclosure will now be described, by way of embodiments, with reference to the attached figures.

DETAILED DESCRIPTION

Figure 1:
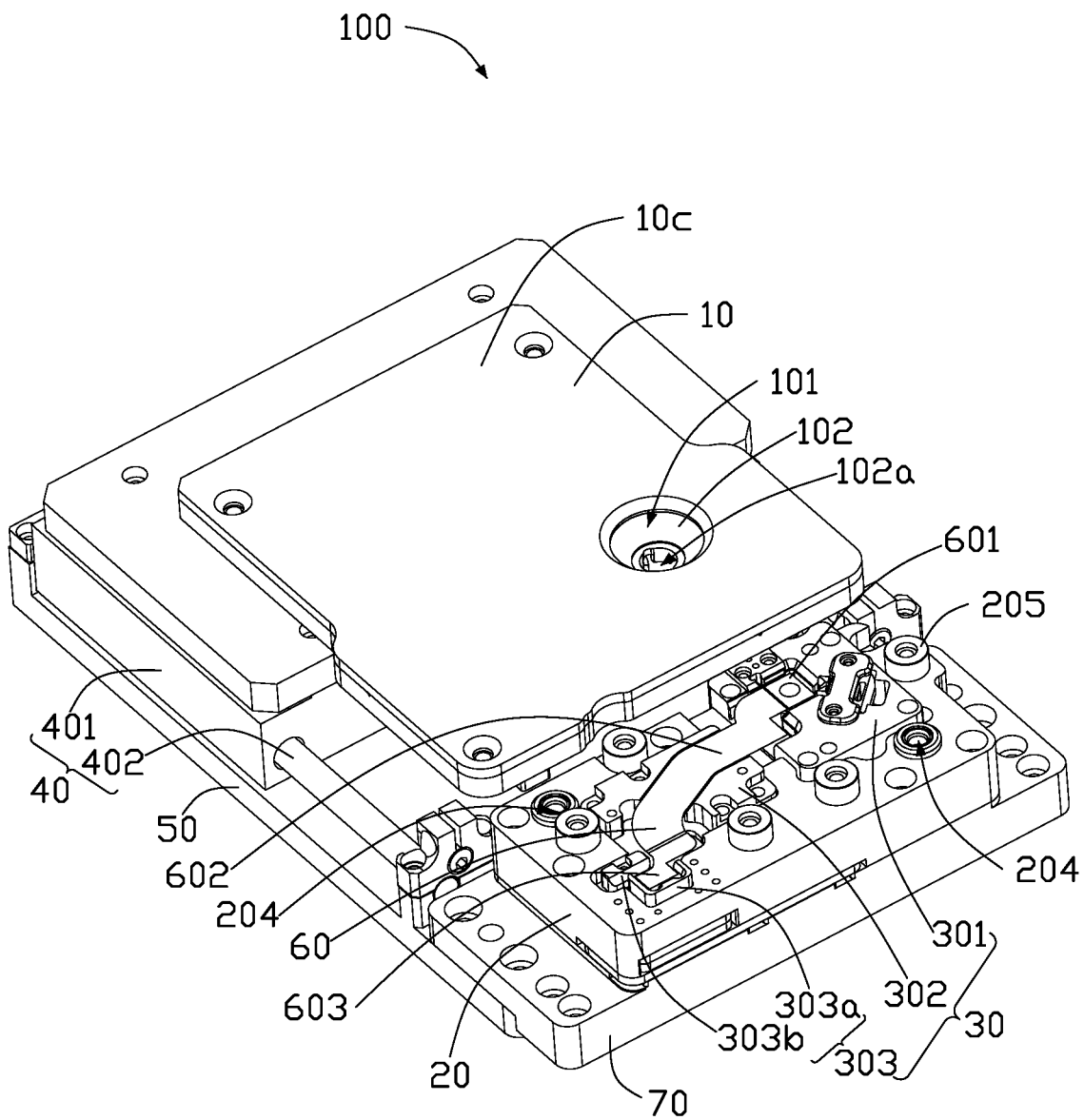
FIG. 1 is an assembled, isometric view of an embodiment of a camera module testing fixture.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows an embodiment of a camera module testing fixture 100 configured to test whether a performance of a camera module 60 meets specific requirements. The camera module 60 includes a lens component 601, a flexible board 602, and a connection component 603. The lens component 601 and the connection component 603 are coupled together by the flexible board 602.

The camera module testing fixture 100 includes a cover 10, a mounting body 20, a fixture block set 30, an actuating module 40, a base 50, and a vacuum pumping unit (not shown).

The fixture block set 30 is detachably mounted to the mounting body 20. The mounting body 20 and the actuating module 40 are disposed on a same first side of the base 50. The vacuum pumping unit is disposed on a second side of the base 50 opposite to the first side. The vacuum pumping unit is coupled to the fixture block set 30 through a vacuum suction tube 701 (shown in FIG. 2).

The cover 10 is fixed on the actuating module 40. The actuating module 40 is configured to move the cover 10 along a first direction (such as horizontally) to above the fixture block set 30. The actuating module 40 is further configured to move the cover 10 along a second direction (such as vertically) perpendicular to the first direction and perpendicular to the mounting body 20. The actuating module 40 includes a main body 401 and two guide rails 402. The cover 10 is fixed to the main body 401. The main body 401 is moved along the first direction along the guide rail 402 or along the second direction perpendicular to the guide rail 402, thereby driving the cover 10 to move horizontally along the guide rail 402 or vertically perpendicular to the guide rail 402.

The camera module testing fixture 100 further includes a fixing plate 70. The mounting body 20 is disposed on the base 50 through the fixing plate 70.

Figure 2:
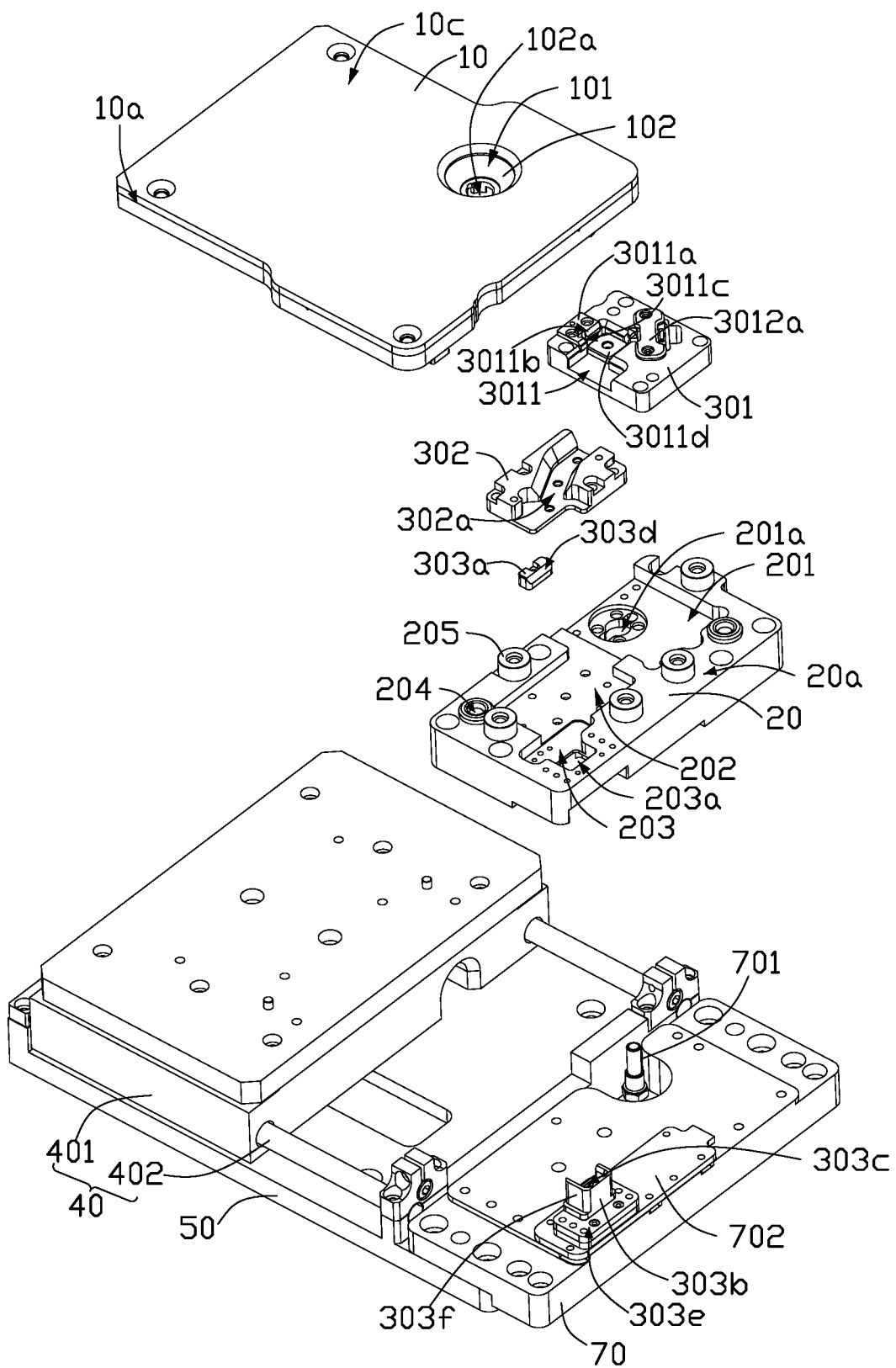
FIG. 2 is an exploded, isometric view of the camera module testing fixture in FIG. 1.
Figure 3:
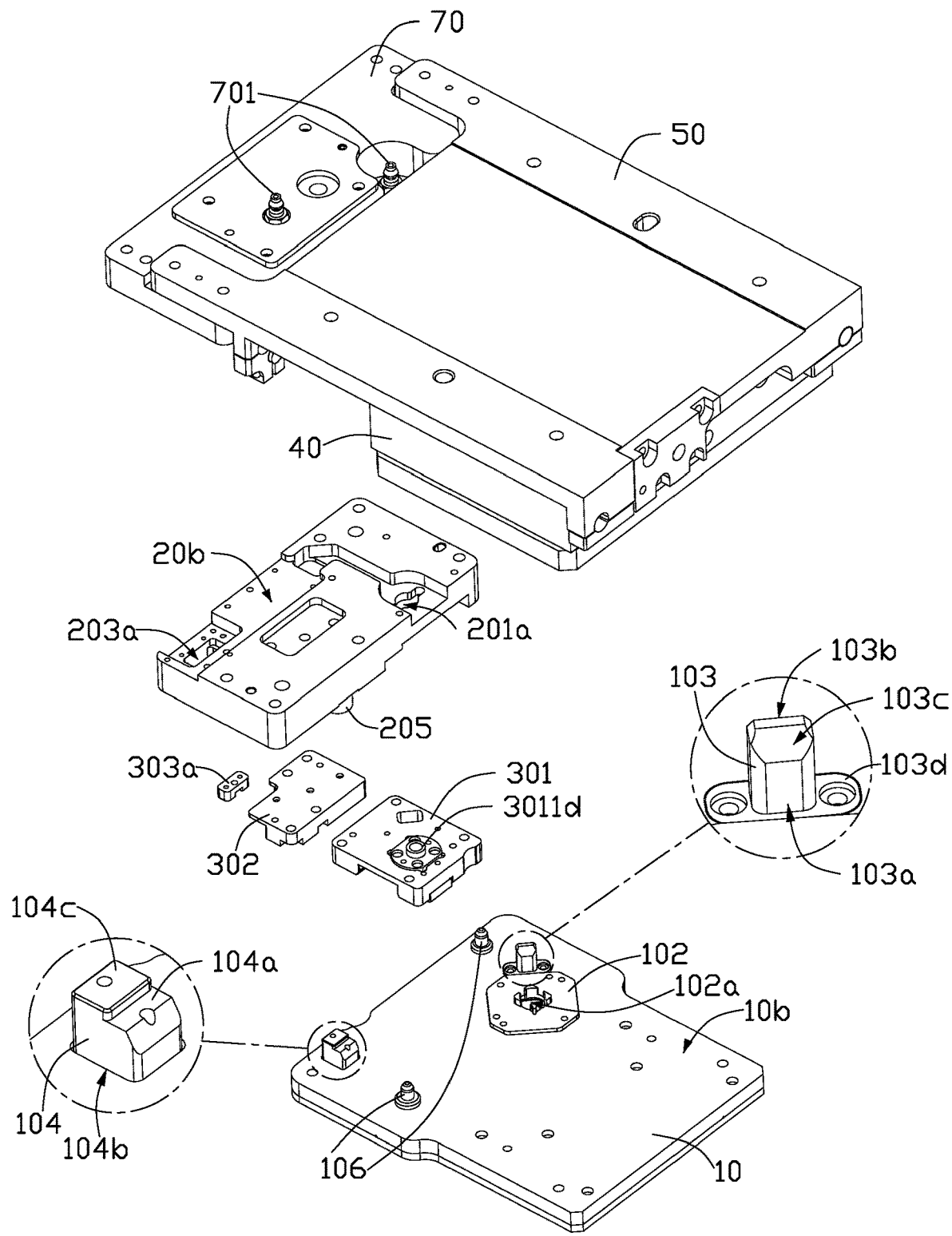
FIG. 3 is similar to FIG. 2, but showing the camera module testing fixture from another angle.
Figure 4:
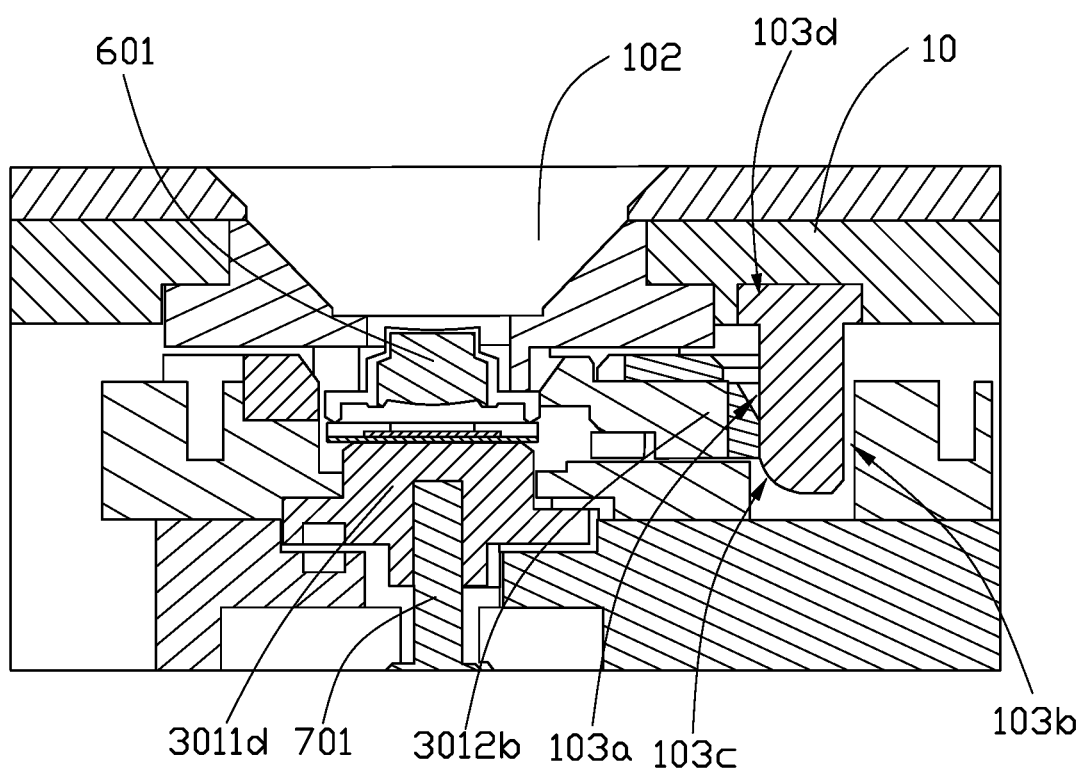
FIG. 4 is a cross-sectional view of the camera module testing fixture.

Referring to FIGS. 2-4, the cover 10 includes a lens pushing block 102, a first fixture pushing block 103, and a second fixture pushing block 104.

The cover 10 has a first surface 10a and a second surface 10b parallel to the first surface 10a. An anti-reflective sheet 10c is disposed on the first surface 10a. The anti-reflective sheet 10c has a same shape as the cover 10 and is used for reducing adverse effects of ambient light on the camera module 60 during testing. The second surface 10b of the cover 10 is fixed on the actuating module 40.

A concavity 101 is defined through the cover 10 and the anti-reflective sheet 10c. The lens pushing block 102 is received in the concavity 101. The lens pushing block 102 defines a detection hole 102a in a center of the concavity 101. The detection hole 102a is aligned with the lens component 601 during testing.

The first fixture pushing block 103 is disposed on the second surface 10b adjacent to the detection hole 102a. The first fixture pushing block 103 includes a plurality of third surfaces 103a substantially perpendicular to the second surface 10b and a fourth surface 103b substantially perpendicular to the third surfaces 103a and substantially parallel to the second surface 10b. The third surfaces 103a and the fourth surface 103b are joined by a plurality of curved surfaces 103c. A fixing seat 103d is coupled to an end of the first fixture pushing block 103. The first fixture pushing block 103 is fixedly coupled to the second surface 10b by the fixing seat 103d.

The second fixture pushing block 104 is disposed on the second surface 10b. The second fixture pushing block 104 includes a first stepped surface 104a substantially parallel to the second surface 10b. A second stepped surface 104c protrudes from the first stepped surface 104a.

A plurality of positioning posts 106 protrudes from the second surface 10b.

The mounting body 20 includes a fifth surface 20a and a sixth surface 20b substantially parallel to the fifth surface 20a. The mounting body 20 is fixed to the fixing plate 70 by the sixth surface 20b.

A first receiving groove 201, a second receiving groove 202, and a third receiving groove 203 are defined in the fifth surface 20a. The first receiving groove 201 communicates with the second receiving groove 202. The second receiving groove 202 communicates with the third receiving groove 203.

A first through hole 201a, a second through hole 202a, and a third through hole 203a are respectively defined in the first receiving groove 201, the second receiving groove 202, and the third receiving groove 203. The first through hole 201a, the second through hole 202a, and the third through hole 203a each penetrate the fifth surface 20a and the sixth surface 20b.

A plurality of positioning holes 204 corresponding to the positioning posts 106 is defined in the fifth surface 20a, and a plurality of cushion rings 205 protrudes from the fifth surface 20a. The cushion rings 205 are configured to bear the cover 10 and prevent the cover 10 from continuing to move. The actuating module 40 drives the cover 10 to move along the first direction (horizontally) to above the fixture block set 30, until the positioning posts 106 are respectively aligned with the positioning holes 204. Then, the cover 10 is moved along the second direction perpendicular to the first direction such that the positioning posts 106 extend into the positioning holes 204 and the second surface 10b contacts the cushion rings 205. The cushion rings 205 can be made of elastic material.

The fixture block set 30 includes a first fixture block 301, a second fixture block 302, and a third fixture block 303. The first fixture block 301, the second fixture block 302, and the third fixture block 303 are detachably mounted to the mounting body 20. The first fixture block 301 corresponds to the first receiving groove 201, and the first fixture pushing block 103 is extendable through the first receiving groove 201. The second fixture block 302 corresponds to the second receiving groove 202. The third fixture block 303 corresponds to the third receiving groove 203. The second fixture pushing block 104 is extendable through the third receiving groove 203.

The first fixture block 301 is detachably received in the first receiving groove 201. A side of the first fixture block 301 facing away from the mounting body 20 defines a lens receiving groove 3011 and includes a lateral pushing mechanism 3012a and a reference block 3011a. The lens receiving groove 3011 is for receiving the lens component 601. A shape and size of the lens receiving groove 3011 can be changed according to an actual shape and size of the lens component 601. The lateral pushing mechanism 3012a and the reference block 3011a are disposed on opposite sides of the lens receiving groove 3011.

The lateral pushing mechanism 3012a includes a lateral pushing block 3012b and a pull-back spring (not shown). One end of the pull-back spring is fixed in the first fixture block 301, and another end of the pull-back spring is fixed on the lateral pushing block 3012b. During a process of the first fixture pushing block 103 extending into the first receiving groove 201, the lateral pushing block 3012b abuts against the curved surface 103c of the first fixture pushing block 103. Then, the lateral pushing block 3012b is moved toward the reference block 3011a. At this time, the pull-back spring is stretched. After the first fixture pushing block 103 is withdrawn from the first receiving groove 201, an elastic restoring force of the pull-back spring pulls the lateral pushing block 3012b to reset a position of the lateral pushing block 3012b.

The reference block 3011a includes a first bearing surface 3011b and a second bearing surface 3011c perpendicular to the first bearing surface 3011b. The first bearing surface 3011b and the second bearing surface 3011c face the lens receiving groove 3011. The first bearing surface 3011b and the second bearing surface 3011c are disposed perpendicular to the fifth surface 20a.

During testing, the cover 10 is moved to above the fixture block set 30 by the actuating module 40, and then moved toward the fixture block set 30 by the actuating module 40. Referring to FIG. 4, when the first fixture pushing block 103 extends into the first receiving groove 201, the curved surface 103c pushes the lateral pushing block 3012b, and the lateral pushing block 3012b pushes the lens component 601 until the lens component 601 abuts against the first bearing surface 3011b and/or the second bearing surface 3011c. After testing, the first fixture pushing block 103 is moved away from the first fixture block 301, and the lateral pushing mechanism 3012a is retracted to the original position by the pull-back spring. The lens component 601 is pushed against the reference block 3011a by the lateral pushing block 3012b, which facilitates alignment of the lens component 601 with the lens pushing block 102, thereby improving efficiency of testing.

In one embodiment, a suction cup 3011d is fixedly mounted in the lens receiving groove 3011, and the vacuum suction tube 701 passes through the first through hole 201a and communicates with the suction cup 3011d. During testing, the vacuum pumping unit is started, and a negative pressure generated causes the suction cup 3011d to adsorb the lens component 601 to fix the lens component 601 in place. After testing is completed, the vacuum pumping unit is stopped, and the lens component 601 is disengaged from the suction cup 3011d. Fixing the lens component 601 by vacuum suction can prevent warping of the lens component 601 and improve accuracy of testing.

The second fixture block 302 is detachably received in the second receiving groove 202. A surface of the second fixture block 302 defines a flexible board receiving groove 302a for receiving the flexible board 602. A shape and size of the flexible board receiving groove 302a can be changed according to an actual shape and size of the flexible board 602 of the camera module 60.

The flexible board receiving groove 302a defines a plurality of vent holes 302b in communication with the second through hole 202a. The vacuum suction tube 701 communicates with the second through hole 202a. During testing, the vacuum pumping unit draws air, and the generated negative pressure compresses the flexible board 602 and the second fixture block 302 to temporarily fix the flexible board 602. After testing is completed, the vacuum pumping unit is stopped, and the flexible board 602 is detached from the second fixture block 302. Fixing the flexible board 602 by vacuuming can prevent warping of the flexible board 602 and improve accuracy of testing.

The third fixture block 303 is detachably received in the third receiving groove 203 and includes a guiding block 303a. The guiding block 303a includes a guiding surface 303d for assisting the connection component 603 of the camera module 60 to be aligned in the third receiving groove 203.

The fixing plate 70 includes a circuit board 702. The circuit board 702 includes a pin holder 303b. The pin holder 303b is received in the third receiving groove 203 through the third through hole 203a and is adjacent to the guiding block 303a. The pin holder 303b includes a pin holder seat 303e and a pin receiving portion 303f extending from the pin holder 303e away from the fixing plate 70. The pin receiving portion 303f defines a recess (not shown) extending through the pin receiving portion 303f to form an opening (not shown) on a side facing the guiding block 303a. The guiding block 303a is located in the opening to close a periphery of the recess, and a portion of the connection component 603 is received in the recess.

A test pin 303c is disposed on a bottom surface of the recess and is electrically coupled to the circuit board 702. When the connection component 603 is received in the third receiving groove 203, the test pin 303c is electrically coupled to the connection component 603, and the circuit board 702 tests an electrical performance of the camera module 60.

During testing, the cover 10 is moved to above the fixture block set 30 by the actuating module 40, and then moved toward the fixture block set 30 by the actuating module 40. When the second fixture pushing block 104 protrudes into the third receiving groove 203, the second stepped surface 104c of the second fixture pushing block 104 protrudes into the recess and abuts against the connection component 603. Thus, a stable electrical connection between the test pin 303c and the connection component 603 is achieved. After testing is completed, the second fixture pushing block 104 is moved out of the recess, and the test probe 303c is disconnected from the connection component 603.

The camera module testing fixture 100 adopts a split module design, and divides the original fixture block set for accommodating the camera module into a plurality of independent fixture blocks, that is, the first fixture block 301, the second fixture block 302, and the third fixture block 303. When a structure of the camera module is changed, a structure of the corresponding fixture block can be changed without needing to replace the whole camera module testing fixture 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A camera module testing fixture for testing a performance of a camera module, the camera module comprising a lens component, a flexible board, and a connection component, the camera module testing fixture comprising:
    a mounting body; and
    a fixture block set; wherein:
    the fixture block set comprises a first fixture block, a second fixture block, and a third fixture block;
    the first fixture block, the second fixture block, and the third fixture block are independent from each other and are detachably mounted on the mounting body;
    the first fixture block, the second fixture block, and the third fixture block respectively receive the lens component, the flexible board, and the connection component of the camera module.

2. The camera module testing fixture of claim 1, wherein:
    the mounting body defines a first receiving groove, a second receiving groove, and a third receiving groove;
    the first receiving groove is for receiving the first fixture block;
    the first fixture block defines a lens receiving groove for receiving the lens component;
    the second receiving groove is for receiving the second fixture block;
    the second fixing block defines a flexible board receiving groove for receiving the flexible board;
    the third receiving groove is for receiving the third fixture block;
    the third fixture block comprises a guiding block for assisting the connection component to be aligned in the third receiving groove;
    the first receiving groove communicates with the second receiving groove;
    the second receiving groove communicates with the third receiving groove.

3. The camera module testing fixture of claim 2, wherein:
    the first fixture block comprises a suction cup in the lens receiving groove;
    a plurality of vent holes is defined in the flexible board receiving groove;
    the first receiving groove defines a first through hole communicating with the plurality of vent holes;
    the second receiving groove defines a second through hole;
    during testing, a negative pressure is generated through the first through hole and the plurality of vent holes by a vacuum pumping unit to cause the suction cup to adsorb the lens component in the lens receiving groove;
    the flexible board is adsorbed in the flexible board receiving groove through the second through hole.

4. The camera module testing fixture of claim 2, further comprising a cover, wherein:
    the cover is configured to move relative to the fixture block set;
    a side of the cover facing the fixture block set comprises a first fixture pushing block;
    a side of the first fixture block facing away from the mounting body comprises a lateral pushing mechanism and a reference block;
    the lateral pushing mechanism and the reference block are respectively disposed on opposite sides of the lens receiving groove;
    the lateral pushing mechanism comprises a lateral pushing block;
    the first fixture block is fixed to one end of a pull-back spring;
    the lateral pushing block is fixed to another end of the pull-back spring;
    the reference block comprises a first bearing surface and a second bearing surface;
    the second bearing surface is perpendicular to the first bearing surface;
    the first bearing surface and the second bearing surface are disposed facing the lens receiving groove;
    the first bearing surface and the second bearing surface are perpendicular to the mounting body;
    the first fixture pushing block is configured to extend into the first receiving groove during a process of the cover moving to above the fixture block set and abut against at least one of the first bearing surface and the second bearing surface;

the lateral pushing block is reset in an original position by the pull-back spring.

5. The camera module testing fixture of claim 4, wherein:
the cover further comprises a lens pushing block;
a concavity is defined through the cover;
the lens pushing block is received in the concavity;
a detection hole is defined in a center of the lens pushing block and the concavity;
the detection hole is aligned with the lens component during testing.

6. The camera module testing fixture of claim 5, wherein:
a second fixture pushing block is disposed on a same side of the cover and the first fixture pushing block;
a pin holder is received in the third receiving groove aligned with the first fixture block;
the pin holder comprises a test pin;
the second fixture pushing block is configured to extend into the third receiving groove when the cover is moved to above the fixture block set and abut against the connection component to realize electrical connection between the connection component and the test pin.

7. The camera module testing fixture of claim 6, wherein:
at least one positioning post protrudes from a same side of the cover and the first fixture pushing block;
a side of the mounting body facing the cover comprises a plurality of cushion rings and defines at least one positioning hole;
the at least one positioning post is configured to extend into the at least one positioning hole to limit movement of the cover;
the plurality of cushion rings are configured to bear the cover and limit movement of the cover.

8. The camera module testing fixture of claim 6, wherein:
a side of the cover facing away from the fixture block set comprises an anti-reflective sheet.

9. The camera module testing fixture of claim 6, further comprising an actuating module, wherein:
the actuating module comprises a main body;
the cover is fixedly mounted on the main body;
the main body is configured to move the cover.

10. The camera module testing fixture of claim 9 further comprising a fixing plate and a base, wherein:
the mounting body and the actuating module are mounted on a same side of the base;
the mounting base is fixedly mounted on the base by the fixing plate;
the fixing plate comprises a circuit board;
the pin holder is mounted on and electrically coupled to the circuit board;
the circuit board is configured to test an electrical performance of the lens module.

11. A camera module testing fixture for testing a performance of a camera module, the camera module testing fixture comprising:
a mounting body;
a fixture block set detachably mounted to the mounting body;
an actuating module;
a cover fixed on the actuating module;
a base; wherein:
the mounting body and the actuating module are disposed on a same first side of the base;
the actuating module is configured to move the cover along a first direction to above the fixture block set, and further configured to move the cover along a second direction perpendicular to the first direction and perpendicular to the mounting body;
the fixture block set comprises a first fixture block, a second fixture block, and a third fixture block;
the first fixture block, the second fixture block, and the third fixture block are independent from each other and are detachably mounted on the mounting body;
the first fixture block, the second fixture block, and the third fixture block respectively receive a lens component, a flexible board, and a connection component of the camera module.

12. The camera module testing fixture of claim 11, wherein:
the mounting body defines a first receiving groove, a second receiving groove, and a third receiving groove;
the first receiving groove is for receiving the first fixture block;
the first fixture block defines a lens receiving groove for receiving the lens component;
the second receiving groove is for receiving the second fixture block;
the second fixing block defines a flexible board receiving groove for receiving the flexible board;
the third receiving groove is for receiving the third fixture block;
the third fixture block comprises a guiding block for assisting the connection component to be aligned in the third receiving groove;
the first receiving groove communicates with the second receiving groove;
the second receiving groove communicates with the third receiving groove.

13. The camera module testing fixture of claim 12, wherein:
the first fixture block comprises a suction cup in the lens receiving groove;
a plurality of vent holes is defined in the flexible board receiving groove;
the first receiving groove defines a first through hole communicating with the plurality of vent holes;
the second receiving groove defines a second through hole;
during testing, a negative pressure is generated through the first through hole and the plurality of vent holes by a vacuum pumping unit to cause the suction cup to adsorb the lens component in the lens receiving groove;
the flexible board is adsorbed in the flexible board receiving groove through the second through hole.

14. The camera module testing fixture of claim 13, further comprising a cover, wherein:
the cover is configured to move relative to the fixture block set;
a side of the cover facing the fixture block set comprises a first fixture pushing block;
a side of the first fixture block facing away from the mounting body comprises a lateral pushing mechanism and a reference block;
the lateral pushing mechanism and the reference block are respectively disposed on opposite sides of the lens receiving groove;
the lateral pushing mechanism comprises a lateral pushing block;
the first fixture block is fixed to one end of a pull-back spring;
the lateral pushing block is fixed to another end of the pull-back spring;
the reference block comprises a first bearing surface and a second bearing surface;

the second bearing surface is perpendicular to the first bearing surface;

the first bearing surface and the second bearing surface are disposed facing the lens receiving groove;

the first bearing surface and the second bearing surface are perpendicular to the mounting body;

the first fixture pushing block is configured to extend into the first receiving groove during a process of the cover moving to above the fixture block set and abut against at least one of the first bearing surface and the second bearing surface;

the lateral pushing block is reset in an original position by the pull-back spring.

15. The camera module testing fixture of claim 14, wherein:

the cover further comprises a lens pushing block;

a concavity is defined through the cover;

the lens pushing block is received in the concavity;

a detection hole is defined in a center of the lens pushing block and the concavity;

the detection hole is aligned with the lens component during testing.

16. The camera module testing fixture of claim 15, wherein:

a second fixture pushing block is disposed on a same side of the cover and the first fixture pushing block;

a pin holder is received in the third receiving groove aligned with the first fixture block;

the pin holder comprises a test pin;

the second fixture pushing block is configured to extend into the third receiving groove when the cover is moved to above the fixture block set and abut against the connection component to realize electrical connection between the connection component and the test pin.

17. The camera module testing fixture of claim 16, wherein:

at least one positioning post protrudes from a same side of the cover and the first fixture pushing block;

a side of the mounting body facing the cover comprises a plurality of cushion rings and defines at least one positioning hole;

the at least one positioning post is configured to extend into the at least one positioning hole to limit movement of the cover;

the plurality of cushion rings are configured to bear the cover and limit movement of the cover.

18. The camera module testing fixture of claim 17, wherein:

a side of the cover facing away from the fixture block set comprises an anti-reflective sheet.

19. The camera module testing fixture of claim 18, further comprising a fixing plate and a base, wherein:

the mounting body and the actuating module are mounted on a same side of the base;

the mounting base is fixedly mounted on the base by the fixing plate;

the fixing plate comprises a circuit board;

the pin holder is mounted on and electrically coupled to the circuit board;

the circuit board is configured to test an electrical performance of the lens module.

* * * * *